United States Patent
Ueta

(10) Patent No.: US 12,256,589 B2
(45) Date of Patent: Mar. 18, 2025

(54) LIGHT-EMITTING ELEMENT AND METHOD FOR MANUFACTURING SAME

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 488 days.

(21) Appl. No.: 17/769,982

(22) PCT Filed: Oct. 29, 2019

(86) PCT No.: PCT/JP2019/042282
§ 371 (c)(1),
(2) Date: Apr. 18, 2022

(87) PCT Pub. No.: WO2021/084597
PCT Pub. Date: May 6, 2021

(65) Prior Publication Data
US 2022/0359844 A1    Nov. 10, 2022

(51) Int. Cl.
*H10K 30/80* (2023.01)
*H10K 71/00* (2023.01)
*H10K 102/00* (2023.01)

(52) U.S. Cl.
CPC ......... *H10K 30/865* (2023.02); *H10K 71/00* (2023.02); *H10K 2102/351* (2023.02); *H10K 2102/361* (2023.02)

(58) Field of Classification Search
CPC ....... H10K 71/10–861; H10K 2101/50; H10K 50/81–818; H10K 50/14–155; H05B 33/06–14; H05B 33/26–28
See application file for complete search history.

(56) References Cited

U.S. PATENT DOCUMENTS

| | | | |
|---|---|---|---|
| 2005/0084713 A1 | 4/2005 | Kido et al. | |
| 2010/0264407 A1 | 10/2010 | Murata et al. | |
| 2015/0048361 A1* | 2/2015 | Yamakita | H01L 29/78606 257/43 |
| 2021/0273196 A1* | 9/2021 | Fang | H10K 50/171 |

FOREIGN PATENT DOCUMENTS

| | | |
|---|---|---|
| JP | 2005-123094 A | 5/2005 |
| JP | 2011-107476 A | 6/2011 |
| JP | 2015-036797 A | 2/2015 |
| WO | 2009/063859 A1 | 5/2009 |

* cited by examiner

*Primary Examiner* — Amar Movva
*Assistant Examiner* — Eric Manuel Mulero Flores
(74) *Attorney, Agent, or Firm* — ScienBiziP, P.C.

(57) ABSTRACT

A light-emitting element includes, in order of listing, an anode, an hole transport layer, an emission layer, and a cathode. The light-emitting element includes an reducing material disposed in at least a part between the anode and the hole transport layer, being in contact with the anode and the hole transport layer, and containing a reducing material that reduces a layer having the hole transport layer. The reducing material contains, in a structure of the reducing material, hydrogen either at a concentration ratio of 1 to 1 with resect to a base metal, or at a larger concentration ratio than the base metal.

19 Claims, 5 Drawing Sheets

LIGHT-EMITTING ELEMENT AND METHOD FOR MANUFACTURING SAME

TECHNICAL FIELD

The present disclosure relates to a light-emitting element and a method for manufacturing the same.

BACKGROUND ART

Referring to carrier (electrons and holes) injection into a self-luminous light-emitting element, including an organic light-emitting diode (OLED), a quantum-dot light-emitting diode (QLED), and an inorganic light-emitting diode, efficiently injecting both carriers individually to an emission layer requires proper selection of the energy level of each carrier injection layer.

Patent Literature 1 for instance discloses lowering an energy barrier (i.e., an electron injection barrier), which causes problems in electron injection from a cathode into a low-resistance electron transport layer, by forming an organometallic-complex-containing layer onto a mixed layer (low-resistance electron transport layer) composed of an electron-donating metal dopant and an organic substance and being adjacent to an emission layer consisting of an organic compound, followed by evaporating, onto the formed layer, as a cathode, a thermo-reducing metal, capable of reducing the metal ions within the organometallic-complex-containing layer into a metal in a vacuum, to thus cause an oxidation-reduction reaction, or evaporating the thermo-reducing metal onto the organometallic-complex-containing layer to cause an oxidation-reduction reaction, followed by forming a cathode.

CITATION LIST

Patent Literature

Patent Literature 1: Japanese Unexamined Patent Application Publication No. 2005-123094

SUMMARY

Technical Problem

However, Patent Literature 1 is directed to lowering an electron injection barrier rather than lowering a hole injection barrier.

For a QLED for instance, holes and electrons are confined within a quantum dot efficiently and are rejoined together to generate excitations, thus emitting light; hence, the material of the quantum dot cannot be selected freely. The energy level of a quantum-dot layer, which is an emission layer, is determined based on the material of the quantum dots. For instance, the ionization potential relating to hole injection of a currently used quantum-dot layer stands at around 5 eV or greater. To inject holes into such a quantum-dot layer, a hole-transporting material and an anode material need to be used that harmonize with a large ionization potential. Such a hole-transporting material and such an anode material are unfortunately still under development.

A metal that is used for an anode does not have such a large work function as to harmonize with the ionization potential of the currently-used quantum-dot layer.

In addition to the foregoing, a hole-transporting material that is used for a hole transport layer, which is a layer capable of transporting holes, or is used for a hole injection layer typically contains a p-type impurity having activation energy that is higher than the thermal energy of room temperature by about equal to or greater than 10 times, and the hole-transporting material tends to have a large effect of compensation for holes, which are p-type carriers. Hence, a p-type hole-transporting material having holes of high concentration is difficult to obtain. Accordingly, a hole-transporting material that is used for such a hole transport layer or hole injection layer is typically a weak p-type and has Fermi level close to the middle of a band gap, and hence, it is difficult to increase hole density.

In a known light-emitting element, a hole injection barrier, i.e., the energy difference between the upper end (hereinafter, referred to as a "valence band level") of the valence band of a hole transport layer and the work function of an anode is large, thereby unfortunately making efficient hole injection into an emission layer difficult.

Lowering the hole injection barrier requires use of an anode material having an extremely large work function, or considerable increase in the hole density of the hole transport layer. It is unfortunately very difficult to obtain such a material including a method of film formation, as described above.

To solve the foregoing problem, it is an object of one aspect of the present disclosure to provide a light-emitting element and a method for manufacturing the same that can lower a hole injection barrier between a hole transport layer and an anode further than before, thus improving the efficiency of hole injection into an emission layer.

Solution to Problem

To solve the above problem, a light-emitting element according to one aspect of the present disclosure includes, in order of listing, an anode, a hole transport layer, an emission layer, and a cathode. The light-emitting element includes a reducing-material-containing layer disposed in at least a part between the anode and the hole transport layer. The reducing-material-containing layer is in contact with the anode and the hole transport layer. The reducing-material-containing layer contains a reducing material that reduces the hole transport layer.

To solve the above problem, in a method for manufacturing a light-emitting element according to one aspect of the present disclosure, the light-emitting element includes, in order of listing, an anode, a hole transport layer, an emission layer, and a cathode. The light-emitting element includes a reducing-material-containing layer disposed in at least a part between the anode and the hole transport layer. The reducing-material-containing layer is in contact with the anode and the hole transport layer. The reducing-material-containing layer contains a reducing material that reduces the hole transport layer. The hole transport layer has a defect on a surface being in contact with the reducing-material-containing layer. The method includes the following steps: stacking the reducing-material-containing layer onto an anode so as to be in contact with the anode; stacking the hole transport layer onto the reducing-material-containing layer so as to be in contact with the reducing-material-containing layer, and forming a defect onto the surface of the hole transport layer being in contact with the reducing-material-containing layer, by heating a stack including the anode, the reducing-material-containing layer, and the hole transport layer to reduce the surface.

Advantageous Effect of Disclosure

In the aspects of the present disclosure, the reducing-material-containing layer contains a reducing material that reduces the hole transport layer. This enables the reducing material to reduce the surface of the hole transport layer being in contact with the reducing-material-containing layer. Reducing the surface of the hole transport layer being in contact with the reducing-material-containing layer forms a defect on the surface of the hole transport layer being in contact with the reducing-material-containing layer. The hole transport layer, which has strong ion bonding, has large bonding energy. Hence, the defect formed on the surface of the hole transport layer being in contact with the reducing-material-containing layer is a deep surface defect, thus forming a deep defect level for pinning the Fermi level of the anode. The hole transport layer has Fermi level deeper than a half of a band gap. In the foregoing configuration, the work function of the anode can undergo pinning to a deeper defect level than the Fermi level of the hole transport layer, thereby achieving a work function that is conspicuously larger and more effective than the original work function of the anode. The foregoing configuration can consequently offer a light-emitting element and a method for manufacturing the same that can lower a hole injection barrier between the hole transport layer and anode further than before, thereby improving the efficiency of hole injection into the emission layer.

DESCRIPTION OF EMBODIMENTS

First Embodiment

The following describes aspects of the present disclosure. In the following, a layer formed in a process step anterior to a process step of forming a comparative layer will be referred to as a "lower layer" or will be described using an equivalent word, and a layer formed in a process step posterior to a process step of forming a comparative layer will be referred to as an "upper layer" or will be described using an equivalent word.

Schematic Configuration of Light-Emitting Element

Figure 1:
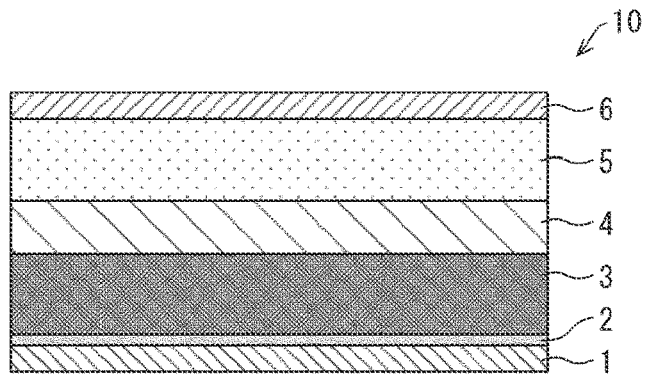
FIG. 1 is a longitudinal sectional view of an example schematic configuration of a light-emitting element according to a first embodiment.

FIG. 1 is a longitudinal sectional view of an example schematic configuration of a light-emitting element 10 according to this embodiment cut in the direction of the normal to the light-emitting element 10 (that is, the light-emitting element 10 cut in its stacking direction).

As illustrated in FIG. 1, the light-emitting element 10 includes an anode 1, a cathode 6, and an emission layer (hereinafter, referred to as an EML) 4 disposed between the anode 1 and cathode 6. Disposed between the anode 1 and EML 4 is a hole transport layer (hereinafter, referred to as an "HTL") 3, which is a layer capable of transporting holes. Disposed between the anode 1 and HTL 3 is a reducing-material-containing layer (hereinafter, referred to as an "REL") 2 being in contact with the anode 1 and HTL 3. Disposed between the EML 4 and cathode 6 may or may not be an electron-transport layer (hereinafter, referred to as an "ETL") 5.

FIG. 1 illustrates, by way of example, the light-emitting element 10 having, in the order of listing, the anode 1, the REL 2, the HTL 3, the EML 4, the ETL 5, and the cathode 6 stacked from the bottom. However, the configuration of the light-emitting element 10 is not limited to the foregoing, as described above.

The anode 1 is made of a conductive material and injects holes into a layer between the anode 1 and cathode 6. The cathode 6 is made of a conductive material and injects electrons into a layer between the cathode 6 and anode 1.

Examples of the conductive material used for the anode 1 include the following: metals that are used for an anode in related art, such as aluminum (Al), silver (Ag), and magnesium (Mg); alloys of these metals; inorganic oxides, such as indium tin oxide (ITO) and indium gallium zinc oxide (InGaZnOx); and conductive compounds containing these inorganic oxides doped with impurities. These conductive materials may be used alone or in combination, as appropriate, with two or more kinds.

Examples of the conductive material used for the cathode 6 include the following: metals that are used for a cathode in related art, such as Al, Ag, and Mg; and alloys of these metals. These conductive materials may be used alone or in combination, as appropriate, with two or more kinds. The foregoing alloys may further contain lithium (Li).

One of the anode 1 and cathode 6 that serves as a surface from which light is taken out needs to be transparent. The other one of these electrodes that is opposite to this light-taking surface may or may not be transparent. At least one of the anode 1 and cathode 6 is thus made of a light-transparency material. One of the anode 1 and cathode 6 may be made of a light-reflective material. When the light-emitting element 10 in FIG. 1 is a top-emission light-emitting element, the cathode 6, which is an upper layer, is made of a light-transparency material, and the anode 1, which is a lower layer, is made of a light-reflective material. When the light-emitting element 10 in FIG. 1 is a bottom-emission light-emitting element, the cathode 6, which is an upper layer, is made of a light-reflective material, and the anode 1, which is a lower layer, is made of a light-transparency material.

The REL 2 is a layer containing a reducing material that reduces the HTL 3 (more strictly, a hole-transporting material that constitutes the HTL 3) and having the action of reduction on the HTL 3. The REL 2 has the function of forming a defect onto a surface of the HTL 3 adjacent to the anode 1 (to be specific, a surface being in contact with the REL 2) after the anode 1 to the HTL 3 are stacked sequentially. This embodiment includes introducing the REL 2 between the anode 1 and HTL 3 in order to introduce a defect onto the surface of the HTL 3, as described above.

This embodiment describes an instance where the REL 2 contains, as a reducing material, a hydrogen-absorbing material, which is referred to as a hydrogen-absorbing metal or hydrogen-absorbing alloy, that can absorb and desorb hydrogen reversibly.

The hydrogen-absorbing material may be a metal or an alloy having the property of absorbing hydrogen through transformation into a solid solution, or the hydrogen-absorbing material may be a metal or an alloy having the property of absorbing hydrogen through chemical bonding.

The reducing material contains at least one of hydrogen-absorbing materials, i.e., a hydrogen-absorbing metal and a hydrogen-absorbing alloy, that absorb hydrogen through transformation into a solid solution, or through chemical bonding. This enables the surface of the HTL 3 being in contact with the REL 2 to undergo reduction using the hydrogen contained in the hydrogen-absorbing metal or hydrogen-absorbing alloy, thereby forming a defect onto the surface of the HTL 3 being in contact with REL 2.

A suitable example of the hydrogen-absorbing material is either at least one hydrogen-absorbing metal or at least one hydrogen-absorbing alloy selected from the group consisting of the following: a metal or an alloy containing at least one element selected from the group consisting of palladium (Pd), platinum (Pt), hafnium (Hf), and tantalum (Ta); a so-called, AB2-type alloy consisting of a transition metal, such as titanium (Ti), manganese (Mn), zirconium (Zr), or nickel (Ni); a so-called, AB5-type alloy with the composition ratio between a rare earth, a rare-earth element, niobium (Nb) or zirconium (Zr), and a transition element having a catalyst effect, such as nickel (Ni), cobalt (Co), or aluminum (Al), standing at 1:5; a Ti—Fe-based alloy, which is an alloy containing titanium and iron; a V-based alloy, which is an alloy containing vanadium; a Mg-based alloy, which is an alloy containing magnesium; a Pd-based alloy, which is an alloy containing palladium; and a Ca-based alloy, which is an alloy containing calcium.

It is desirable that the foregoing reducing material (i.e., the foregoing hydrogen-absorbing material) desirably contain, in its structure, hydrogen either at a concentration ratio of 1 to 1 with respect to a base metal, or at a larger concentration ratio than the base metal. This enables the surface of the HTL 3 being in contact with the REL 2 to undergo reduction efficiently.

Depending on the kind of the reducing material, the REL 2 preferably has a thickness of 0.5 to 1 nm inclusive. The HTL 3 can undergo reduction with certainty when the REL 2 has a thickness equal to or greater than 0.5 nm. Moreover, forming the REL 2 thinly to be 1 nm or smaller thick enables only the uppermost surface of the HTL 3 to undergo reduction and enables hole conduction through tunneling.

When having a thickness equal to or greater than 1 nm, the REL 2 in the form of a flat film can be obtained. In contrast, the REL 2 loses flatness when having a thickness less than 1 nm. Further, a continuous film as shown in FIG. 1 can be obtained when the REL 2 has a thickness equal to or greater than 0.5 nm. The continuous film refers to a dense film having a void ratio of less than 1%. That is, the continuous film refers to a film having no void substantially. However, such a continuous film has surface asperities as thick as its thickness in some cases. In this embodiment, a film in such a state is referred to as a film with flatness lost. It is noted that the REL 2 having a thickness of less than 0.5 nm naturally constitutes an island form rather than a continuous film.

The HTL 3 may be either of a hole transport layer and a hole injection layer. The hole transport layer is a layer that transports holes from the anode 1 to the EML 4. The hole injection layer is a layer that promotes hole injection from the anode 1 to the EML 4. In some embodiments, the hole transport layer may serve also as a hole injection layer. As such, the light-emitting element 10 may include the HTL 3 with a hole injection layer and a hole transport layer stacked on the REL 2 in this order for instance. Alternatively, the light-emitting element 10 may include the HTL 3 with a hole transport layer stacked directly on the REL 2.

The HTL 3 can be made of a known hole-transporting material consisting of a wide-gap compound, a wide-gap metal oxide, or other substances. The HTL 3 may contain an inorganic hole-transporting material, including, but not limited to, a metal oxide or an oxide semiconductor, a group IV semiconductor, a group II-VI compound semiconductor, and a group III-V compound semiconductor, all of which are commonly known as a hole-transporting material. Examples of the metal oxide or oxide semiconductor include, but not limited to, molybdenum trioxide ($MoO_3$), chromium oxide ($Cr_2O_3$), nickel oxide (NiO), tungsten trioxide ($WO_3$), indium tin oxide (ITO), indium gallium zinc oxide (InGaZnOx), gallium oxide ($Ga_2O_3$), and indium oxide ($In_2O_3$). It is noted that the classification between a metal oxide and an oxide semiconductor is not necessarily clear; it is thus safe to say that both are together referred to as "a metal oxide or an oxide semiconductor" in order to achieve a function as the HTL3. Examples of the foregoing group IV semiconductor includes, but not limited to, silicon (Si) and germanium (Ge). Examples of the foregoing group II-VI compound semiconductor include, but not limited to, zinc indium-doped oxide (IZO), zinc aluminum-doped oxide (ZAO), zinc oxide (ZnO), magnesium oxide (MgO), zinc magnesium oxide (ZnMgO), zinc sulfide (ZnS), zinc selenide (ZnSe), zinc sulfide selenide (ZnSSe), magnesium sulfide (MgS), magnesium selenide (MgSe), and magnesium sulfide selenide (MgSSe). Examples of the foregoing group III-V compound semiconductor include, but not limited to, the following: aluminum arsenide (AlAs), gallium arsenide (GaAs), indium arsenide (InAs), and aluminum gallium indium arsenide (AlGaInAs), which is a mixed crystal of these substances; aluminum nitride (AlN), gallium nitride (GaN), indium nitride (InN), aluminum gallium indium nitride (AlGaInN), which is a mixed crystal of these substances; and gallium phosphide (GaP), and aluminum gallium indium phosphide (AlGaInP). These hole-transporting materials are mere examples, and thus the hole-transporting material is not limited to only the foregoing examples. Furthermore, these hole-transporting materials may be used alone or in combination, as appropriate, with two or more kinds. In other words, the HTL 3 may contain at least one hole-transporting material selected from the group consisting of the foregoing example hole-transporting materials. Here, when the HTL 3 is an organic substance, reducing the HTL 3 loses the reliability of the light-emitting element 10. The HTL 3 is hence made of an inorganic substance (i.e., an inorganic hole-transporting material) as described above, even when the light-emitting element 10 is an OLED for instance as described later on.

The ETL 5 may be either of an electron transport layer and an electron injection layer. The electron transport layer is a layer that transports electrons from the cathode 6 to the EML 4. The electron injection layer is a layer that promotes electron injection from the cathode 6 to the EML 4. In some embodiments, the electron transport layer may serve also as an electron injection layer, or the cathode 6 may serve also as an electron injection layer. The light-emitting element 10 may thus include, between the cathode 6 and EML 4, the ETL 5 with an electron injection layer and an electron transport layer on the cathode 6 in this order, or with only an electron transport layer on the cathode 6.

The ETL 5 can be made of a known electron-transporting material. The ETL 5 may contain, as an electron-transporting material, an inorganic electron-transporting material, including, but not limited to, zinc oxide (ZnO), magnesium oxide (MgO), magnesium zinc oxide (ZnMgO), titanium oxide ($TiO_2$), lithium fluoride (LiF), molybdenum trioxide ($MoO_3$), tungsten trioxide ($WO_3$), indium gallium zinc oxide (InGaZnOx), zinc aluminum-doped oxide (ZAO), indium oxide ($In_2O_3$), gallium oxide iodide ($Ga_2OI_3$), zinc sulfide (ZnS), zinc selenide (ZnSe), and zinc telluride (ZnTe); alternatively, the ELT 5 may contain, as an electron-transporting material, an organic electron-transporting material, including, but not limited to, oxadiazoles, triazoles, phenanthrolines, a silole derivative, and a cyclopentadiene derivative. These electron-transporting materials may be used alone or in combination, as appropriate, with two or more kinds.

The HTL 3 and the ETL 5 may have any thickness such that the respective functions of hole transport and electron injection are exerted sufficiently. The HTL 3 and the ETL 5 can be set to have a thickness similar to the thickness of a hole transport layer and to the thickness of an electron transport layer both included in a light-emitting element that is known.

The EML 4 is a layer that contains a light-emitting material and emits light by rejoining of electrons transported from the cathode 6 and holes transported from the anode 1 together.

The EML 4 may contain, as a light-emitting material, nano-sized quantum dots (semiconductor nanoparticles) for instance. The quantum dots can be a known quantum dot. Each quantum dot may contain, for instance, at least one semiconductor material composed of at least one element selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). The quantum dot may be a binary core, a tertiary core, a quaternary core, a core-shell, or a core-multi shell. Alternatively, the quantum dot may contain a nanoparticle doped with at least one of the foregoing elements or may have a composition-graded structure.

The diameter of the quantum dot can be set as before. The diameter of the core of the quantum dot is 1 to 30 nm for instance, and the outermost diameter of the quantum dot including the shell is 1 to 50 nm for instance. Moreover, the light-emitting element 10 has 1 to 20 overlapping layers of quantum dots for instance. The EML 4 may have any thickness that can offer electron-hole rejoining to achieve the function of light emission and can be, for instance, about 1 to 200 nm thick. It is preferable that the EML 4 have a thickness that is about several times greater than the outermost diameter of the quantum dot.

This embodiment is not limited to the foregoing example. The EML 4 may contain, as light-emitting materials, organic light-emitting materials for instance that emit respective colors of light, instead of quantum dots.

When the light-emitting element 10 is a QLED that contains quantum dots as light-emitting materials, as described above, a drive current between the anode 1 and cathode 6 causes hole-electron rejoining within the EML 4, thus generating excitons, which then emit light (fluorescent light) in the process of transition from the conduction band level of the light of quantum dots to the valence band level of the quantum dots.

When the light-emitting element 10 is an OLED that contains an organic light-emitting material as a light-emitting material, a drive current between the anode 1 and cathode 6 causes hole-electron rejoining within the EML 4, thus generating excitons, which then emit light in the process of transition to a ground state.

The light-emitting element 10 may be a light-emitting element (e.g., an inorganic light-emitting diode) other than an OLED and a QLED.

At least one (e.g., multiple) light-emitting element 10 may be included in a light-emitting device, such as an illumination device or a display device, to be used as the light source of the light-emitting device.

The light-emitting element 10 may have a substrate not shown, and the anode 1 may be disposed on the substrate not shown.

Method for Manufacturing Light-Emitting Element 10

Figure 2:
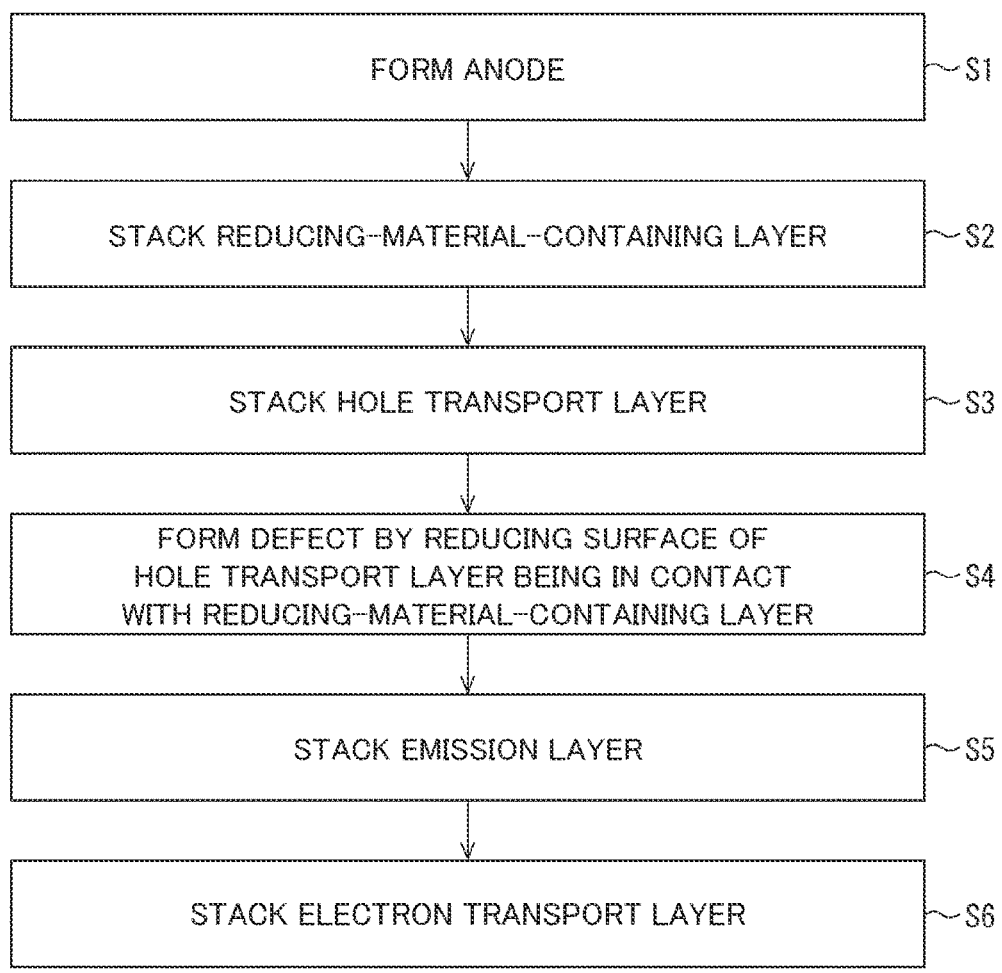
FIG. 2 is a flowchart showing, step by step, process steps for manufacturing the light-emitting element according to the first embodiment.

The following describes, by way of example, a method for manufacturing the light-emitting element 10. FIG. 2 is a flowchart showing, step by step, process steps for manufacturing the light-emitting element 10 according to this embodiment.

As illustrated in FIG. 1 and FIG. 2, the manufacture of the light-emitting element 10 according to this embodiment starts with Step S1, i.e., forming the anode 1 onto a substrate not shown.

This substrate may be, for instance, a glass substrate or a flexible substrate, such as a resin substrate. When the light-emitting element 10 is part of a light-emitting device, such as a display device for instance, the substrate is a substrate of the light-emitting device. The substrate may be thus, for instance, an array substrate with a plurality of thin-film transistors on. The anode 1 in this case is electrically connected to the thin-film transistors of the array substrate. Forming the anode 1 can use various methods that are known as a method of anode formation, including, but not limited to, sputtering, vacuum deposition, chemical vapor deposition (CVD), plasma CVD, and printing.

The next is Step S2, i.e., forming (stacking) the REL 2 onto the anode 1 so as to be in contact with the anode 1. Forming the REL 2 can use sputtering or evaporation for instance.

The next is Step S3, i.e., forming (stacking) the HTL 3 onto the REL 2 so as to be in contact with the REL 2. Forming the HTL 3 can use various methods that are known as a method of forming a hole transport layer, including, but not limited to, sputtering, nanoparticle application, and precursor application.

The next is heating the stack obtained in Step S3. The hydrogen-absorbing metal or hydrogen-absorbing alloy within the REL 2 emits hydrogen in response to heating. The surface of the HTL 3 being in contact with the REL 2 undergoes reduction by the action of strong hydrogen reduction. Accordingly, a defect is formed onto the surface of HTL 3 being in contact with the REL 2. This process step is Step S4.

It is noted that the stack obtained in Step 3 is a stack including the anode 1, REL 2, and HTL 3, and is a stack of, in order of listing, the anode 1, REL 2, and HTL 3 on a substrate not shown, as described above.

In Step S4, the temperature at which the foregoing stack undergoes heating needs to equal to or higher than a temperature at which hydrogen absorbed by the REL 2 is emitted, and this heating temperature desirably stands at equal to or higher than 150° C. and more desirably stands at equal to or higher than 180° C. Although the temperature for heating the stack needs to be, as described above, equal to or higher than a temperature at which hydrogen absorbed by the REL 2 is emitted, the heating temperature desirably stands at equal to or lower than 250° C. and more desirably stands at equal to or lower than 200° C. As such, this embodiment can perform the foregoing reduction at a temperature not exceeding the heat-resistance temperature of a material, such as a glass substrate, that is used in related art as a support for a light-emitting element.

Although the stack may undergo heating at any atmosphere, the stack desirably undergoes heating either in the air or under a nitrogen atmosphere in view of practical use. In this case, a surface opposite to the surface of the HTL 3 being in contact with the REL 2 has no likelihood of reduction. Here, the REL 2 hopefully exerts reduction action under a hydrogen atmosphere as well, but in this case, a surface facing the surface where the HTL 3 is in contact with the REL 2 is also likely to undergo reduction. It is hence desirable to avoid heating under a hydrogen atmosphere.

In this embodiment, forming the REL 2 that is very thin onto the interface between the HTL 3 and anode 1, followed by stacking the anode 1 through the HTL 3, followed by heating the stack can introduce a defect onto the surface of the HTL 3 in a region where the REL 2 is in contact with the HTL 3, as described above.

The HTL 3 in this embodiment, which has ionic bonding, involves a deep surface defect, and pinning the work function of the anode 1 to the level (surface level) of this defect can achieve a work function that is conspicuously larger and more effective than the original work function of the anode 1, as detailed later on. In this embodiment, such increase in effective work function can lower an injection barrier, thus improving hole injection.

Patent Literature 1 discloses a reaction production layer, which is a layer with metal ions within an organometallic-complex layer undergone reduction into a metal in a vacuum. These reaction production layer and organometallic-complex layer are disposed close to the electron injection layer, as earlier described, and can conduct electricity. Patent Literature 1 fails to disclose reducing the hole transport layer to form a surface level, pinning the work function of the anode 1 by using the surface level, or a structure for the pinning.

The next is Step S5, i.e., forming (stacking) the EML 4 onto the HTL 3 so as to be in contact with the HTL 3. Forming the EML 4 can use various methods that are known as a method of forming an emission layer, including, but not limited to, evaporation, printing, ink-jetting, spin coating, casting, dipping, bar coating, blade coating, roll coating, gravure coating, flexographic printing, spray coating, photolithography, and self-assembling (e.g., a layer-by-layer self-assembly method and a self-assembled monolayer method).

The next is Step S6, i.e., forming (stacking) the ETL 5 onto the EML 4 as necessary. The next is forming (stacking) the cathode 6. Forming the ETL 5 can use various methods that are known as a method of forming an electron transport layer. To be specific, forming the ETL 5 can use a method similar to the foregoing method of forming the HTL 3. Forming the cathode 6 can use various methods that are known as a method of forming a cathode. To be specific, forming the cathode 6 can use a method similar to the foregoing method of forming the anode 1.

The light-emitting element 10 can be manufactured through the foregoing process steps. It is noted that when the light-emitting element 10 is part of a display device for instance, the cathode 6 is formed as a common layer shared among all sub-pixels. Each of the anode 1, REL 2, HTL 3, EML 4, and ETL 5 may be provided for each sub-pixel by patterning in conformance with the shape of the sub-pixel after they are formed. Like the cathode 6, the REL 2, the HTL 3, the EML 4, and the ETL 5 except the anode 1 and EML 4 may be provided as a common layer shared among all the sub-pixels.

Effect

Figure 3:
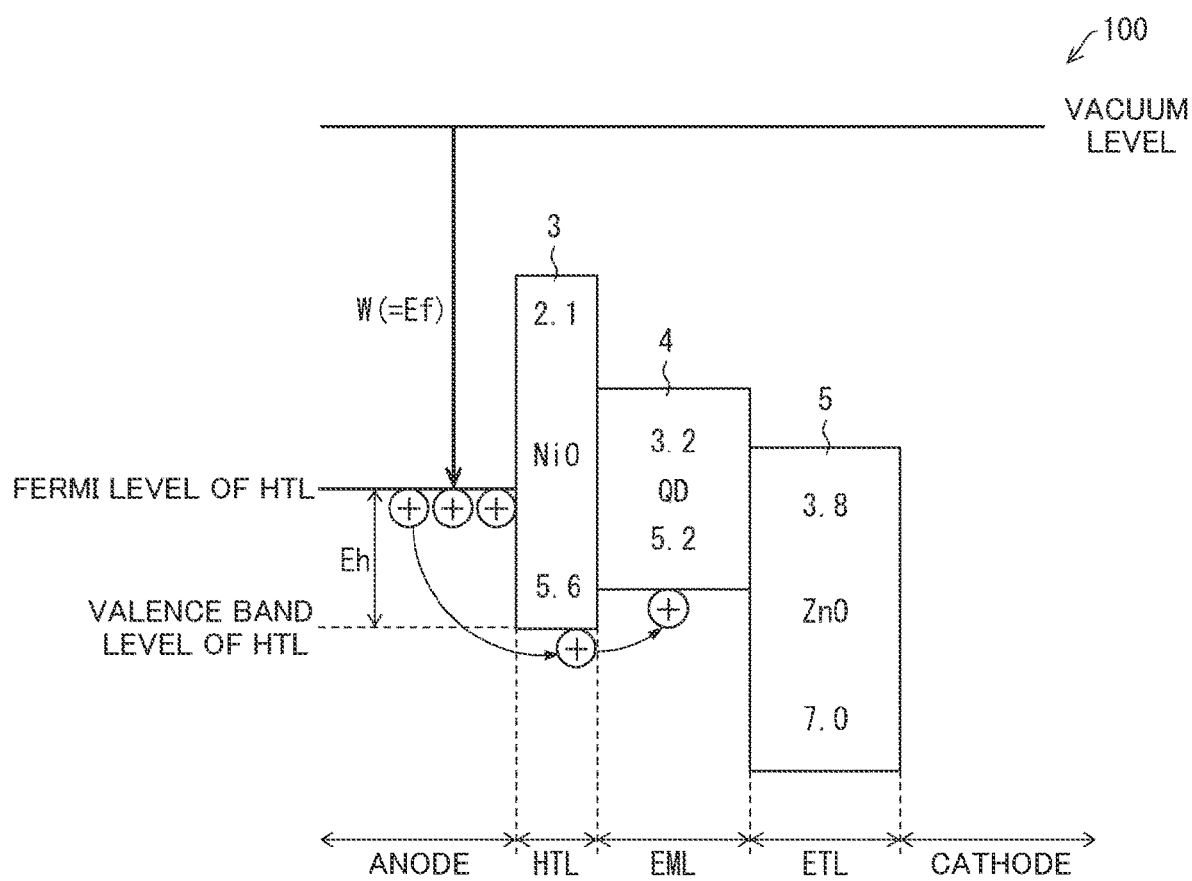
FIG. 3 illustrates an energy band provided for describing a hole injection barrier disposed between a hole transport layer and an anode in a comparative light-emitting element including no reducing-material-containing layer.
Figure 4:
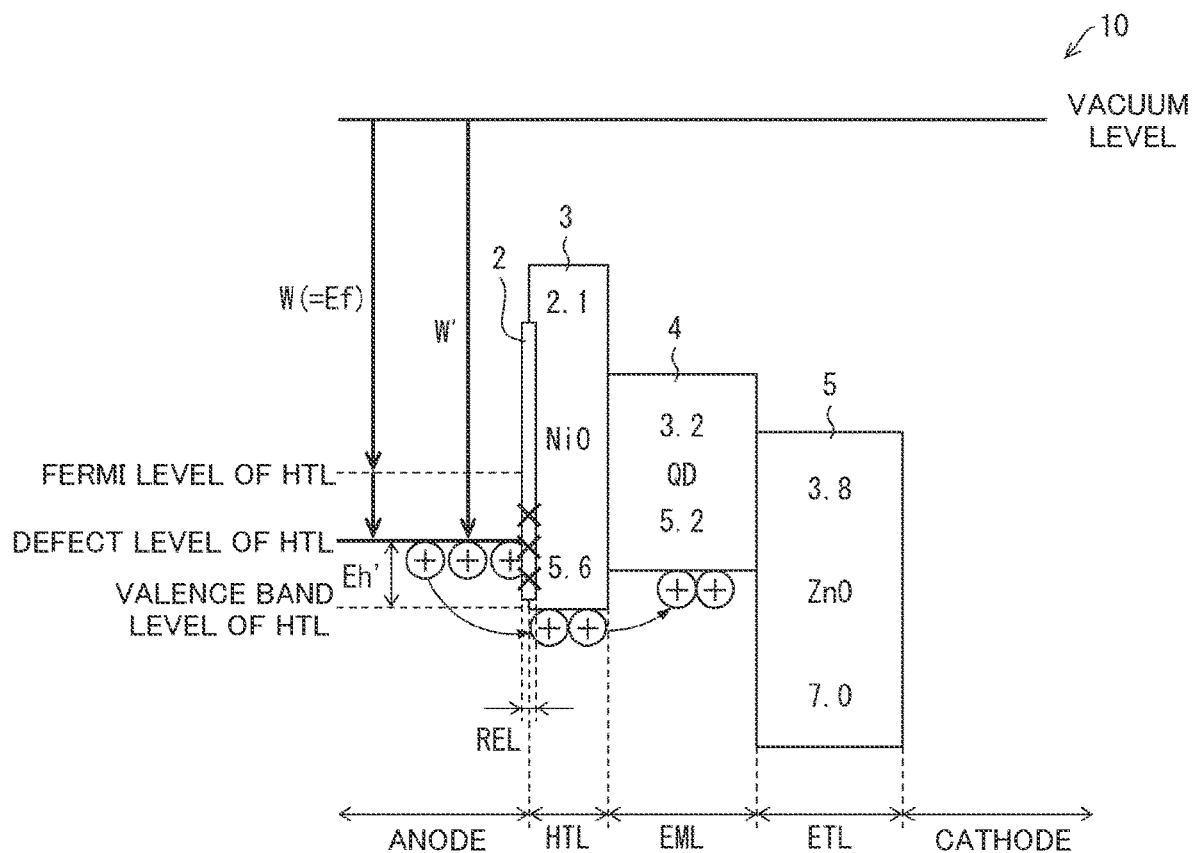
FIG. 4 illustrates an energy band provided for describing a hole injection barrier disposed between a hole transport layer and an anode in the light-emitting element according to the first embodiment.

With reference to FIG. 3 and FIG. 4, the following details an effect of the foregoing pinning.

FIG. 3 illustrates an energy band provided for describing a hole injection barrier Eh disposed between the HTL 3 and anode 1 in a comparative light-emitting element 100, which includes no REL 2. FIG. 4 illustrates an energy band provided for describing a hole injection barrier Eh' disposed between the HTL 3 and anode 1 in the light-emitting element 10 according to this embodiment. The light-emitting element 100 has the same structure as the light-emitting element 10 with the exception that the REL 2 is not provided.

As illustrated in FIG. 3, in the light-emitting element 100, the band is bent in such a manner that the original work function W of the anode 1 and the Fermi level of the HTL 3 are equal at the joint interface between the anode 1 and HTL 3, thus forming the hole injection barrier Eh equal to the energy difference between the original work function W of the anode 1 and the valence band level of the HTL 3. Here, when the anode 1 is metal, the work function W is equal to the difference between a vacuum level and the original Fermi level Ef of the anode 1 at the time when the temperature is equal to absolute zero (T=0K). In other words, when the anode 1 is metal, the work function W of the anode 1 is equal to the Fermi level Ef of the anode 1.

When the light-emitting element 100 is a QLED, a wide-gap compound or a wide-gap metal oxide is typically used for a hole-transporting material that is used for the HTL 3 (hole transport layer or hole injection layer), in order to confine electrons and inject holes into quantum dots having a deep ionization potential. The HTL 3 transports holes, and hence this compound or metal oxide is composed of a p-type compound or a p-type metal oxide.

As earlier described, these hole-transporting materials typically tend to contain p-type impurities having activation energy higher than the thermal energy of room temperature by about equal to or greater than 10 times, and the hole-transporting materials typically tend to have a great compensation effect on holes. It is hence difficult to obtain a p-type hole-transporting material having holes of high concentration. Thus, the Fermi level of the HTL 3 is close to the band gap middle, because these hole-transporting materials have low hole concentration though they are p-type materials. However, these materials are p-type materials, and hence the Fermi level of the HTL 3 is deeper than a half of the band gap.

As earlier described, the energy level of the EML 4, which is an emission layer, is determined depending on the material of quantum dots (QDs) that are used for the EML 4. Ionization potential is equal to valence band level; the ionization potential of the EML 4 of the light-emitting element 100 shown in FIG. 3 measures 5.2 eV, which is over 5 eV and is thus considerably great. Electron affinity is equal to conduction band level; the EML 4 of the light-emitting element 100 shown in FIG. 3 has an electron affinity of 3.2 eV. Moreover, the HTL 3 made of NiO for instance, as illustrated in FIG. 3 has an ionization potential of 5.6 eV and an electron affinity of 2.1 eV. Moreover, the ETL 5 made of ZnO for instance, as illustrated in FIG. 3 has an ionization potential of 7.0 eV and an electron affinity of 3.8 eV.

The hole injection barrier Eh, provided for hole injection from the anode 1 into the HTL 3, is low if the work function W of the anode 1 is deep to a degree close to the ionization potential of the HTL 3, but such an anode material has not been found. Hole injection from the anode 1 into the HTL 3 in the light-emitting element 100 shown in FIG. 3 is thus not easy.

To lower the hole injection barrier between the anode 1 and HTL 3, the HTL 3 in this embodiment undergoes reduction on its surface adjacent to the anode 1, thus introducing a defect (surface defect) of high density onto the surface of the HTL 3 adjacent to the anode 1. The defect formed in such a manner forms a defect level (surface level) that is deeper than the band gap of the HTL 3 by a half or more, thus pinning the Fermi level of the anode 1.

Without a defect on the surface of the HTL 3, the band curves in such a manner that the original work function W of the anode 1 and the Fermi level of the HTL 3 are equal at the bonding interface between the anode 1 and HTL 3, and hence the work function of the anode 1 does not undergo pinning. The original hole injection barrier Eh by material combination is formed in the comparative light-emitting element 100, which includes no REL 2.

The height of the foregoing defect level is determined depending on the bonding state of atoms constituting a host crystal. Energy necessary for defect production (i.e., for bonding release) increases along with increase in the bounding. As earlier described, the HTL 3 is composed of a wide-gap compound or a wide-gap metal oxide as a hole-transporting material. Such a hole-transporting material contains constituent elements ion-bonded together. Ion bonding is strong and has large bonding energy. Accordingly, for a defect of a material having ion bonding, the ion bonding between constituent elements needs to be released, and large energy is required in order to produce a defect for pinning the Fermi level of the anode 1. The defect on the HTL 3 thus constitutes a deep defect level, as described above.

The defect level within a band gap typically has no spread at low defect density, but at high defect density, the defect level within the band gap generally has Gaussian function-like spread with respect to energy. The surface of the HTL 3 undergone reduction by the REL 2 has a defect of high density, and hence the defect level is formed, with spread, deep within the band gap.

The REL 2 is extremely thin, as earlier described, and hence the defects on the HTL 3 are locally located on the surface adjacent to the anode 1. It is noted that a situation where defects are all over the HTL 3 in its thickness direction is undesirable, because the defects in parts of the HTL 3 except a part close to the surface function as a carrier trap. That is, if defects are all over the HTL 3 in its thickness direction, a defect level is introduced all over the HTL 3 in the thickness direction, thereby trapping free carriers, having conductivity, in the defect level at a portion excluding the vicinity of the surface of the HTL 3, thereby increasing the resistance of the HTL 3. This lowers the efficiency of hole injection.

Asperities resulting from the defects on the HTL 3, which are likely to cause delamination or fine pores on the interface with the anode 1, are desirably small. If asperities resulting from the defects on the HTL 3 are large, a carrier trap causes increase in the resistance of the HTL 3, as described above, and hence the asperities are desirably small in order to prevent such resistance increase. To be specific, the asperities resulting from the defects on the HTL 3 desirably have, in the stacking direction, a height equal to or smaller than $\frac{1}{20}$ (i.e., over 0 and equal to or smaller than $\frac{1}{20}$) of the thickness of the HTL 3, and the asperities more desirably have, in the stacking direction, a height equal to or smaller than $\frac{1}{80}$ (i.e., over 0 and equal to or smaller than $\frac{1}{80}$) of the same. To be more specific, the asperities resulting from the defects on the HTL 3 are desirably equal to or smaller than 4 nm (i.e., over 0 and equal to or smaller than 4 nm) for instance, and are more desirably equal to or smaller than 0.5 nm (i.e., over 0 and equal to or smaller than 0.5 nm) for instance.

In this embodiment, such defect formation as described above forms, in the HTL 3, a deeper defect level than the Fermi level of the HTL 3, as illustrated in FIG. 4. This enables the Fermi level of the anode 1 to undergo pinning to the foregoing defect level deeper than the Fermi level of the HTL 3. The Fermi level of the anode 1 is equal to the work function of the anode 1. Thus, the work function of the anode 1 undergoes pinning to the foregoing defect level, which is deeper than the Fermi level of the HTL 3, through the foregoing pinning. This embodiment can accordingly achieve a work function W' that is conspicuously larger and more effective than the original work function W of the anode 1.

This embodiment thus enables the hole injection barrier Eh to effectively lower to the hole injection barrier Eh' having a height corresponding to the energy difference between the defect level of the HTL 3 and the valence band level of the HTL 3, as illustrated in FIG. 4. Here, the hole injection barrier Eh' is the energy difference between the effective work function W' of the anode 1 and the valence band level of the HTL 3, and in this embodiment, the hole injection barrier Eh' corresponds to a value with a defect level subtracted from a half of the band gap of the HTL 3. The light-emitting element in this embodiment can lower a hole injection barrier when compared with the comparative light-emitting element 100, which includes no REL 2.

The HTL 3 that is formed through sputtering is exposed to ion impact at the time of formation, as earlier described, and thus has a defect formed on the surface slightly. In forming the HTL 3 through nanoparticle application, nanoparticles undergo a huge surface impact as a result of a size effect; hence, the HTL 3 in this case as well has a defect formed on the surface slightly. In forming the HTL 3 through precursor application, a chemical reaction is not completed 100%; hence, the HTL 3 in this case as well has a defect formed on the surface slightly. In any of these cases however, the density of a defect formed on the surface of the HTL 3 is not so high as to cause pinning. For this reason, even if the HTL 3 is formed through any of the methods, the hole injection barrier of the light-emitting element 100 is the same as the original hole injection barrier Eh produced by combination of a hole transport material that is used for the HTL 3 and of an anode material.

This embodiment can thus offer the light-emitting element 10 and a method for manufacturing the same that can lower the hole injection barrier between the HTL 3 and anode 1 further than a known light-emitting element including no REL 2, thereby improving the efficiency of hole injection into the EML 4.

Second Embodiment

This embodiment will describe a difference between this embodiment and the first embodiment. For convenience in description, components with the same functions as the components described in the first embodiment will be denoted by the same signs, and their detailed description will be omitted.

The light-emitting element 10 according to this embodiment and a method for manufacturing the same are the same as those in the first embodiment with the exception that the REL 2 contains WOx (x≥3) as a reducing material. The longitudinal sectional view of the light-emitting element 10 according to this embodiment is thus the same as that in FIG. 1.

WOx (x≥3) is a reducing catalyst. For an oxide that is a target substance for reduction, performing reduction (i.e., providing electrons to take away oxygen) requires the target substance be supplied with electrons that exceed an energy barrier corresponding to at least oxygen's bonding, to thus release the bonding of the target substance. However, oxygen within an oxide normally has large bonding energy, and hence promoting reduction requires electron energy to be increased or requires a barrier to be lowered. A reducing catalyst, which has the action of lowering an energy barrier at its interface with a target substance for reduction without changing its state, promotes reduction.

A tungsten oxide, denoted by WOx, is known as taking some forms and can be produced in the form of a film through reactive sputtering using, for instance, a tungsten (W) target as well as oxygen ($O_2$) gas and argon gas (Ar).

$O_2$, which oxidizes W undergone sputtering from a target, can change form by regulating its flow ratio with respect to Ar. Ar is ionized by plasma and sputters W from a target. At this time, mutual action between physical energy exchange and charged particles causes W to undergo sputtering and to simultaneously undergo ionization. The ionized W reacts with O to take three forms: $WO_2$, $WO_3$, and $W_2O_3$; they are easily generated in the order of $WO_3$, $W_2O_3$, and $WO_2$ along with increase in the density of Ar plasma.

The following describes an evaluation result about an effect of reduction of the HTL 3 using the foregoing compounds.

Firstly, 10 nm thick tungsten oxides in the respective forms were formed onto a nickel oxide (NiO) film, which is the HTL 3, and were maintained (heated) at 200° C. for five hours, followed by observation of the surface of the NiO film. Asperities with average roughness of about 50 nm were found on the surface of the NiO film with a $WO_3$ film on. Here, the NiO film before processing had average roughness of about 0.5 nm. The condition, i.e., five-hour heating at 200° C., is for emphasizing the action of reduction on the NiO film, and in actual application to the light-emitting element 10, short-time heating, i.e., heating at less than 200° C. for less than five hours, is required.

The foregoing samples were evaluated with an electron probe micro analyzer (EPMA). Accordingly, no asperities were found on the surface of the sample with a chemical shift corresponding to Ni—O and to Ni alone being observed and with a $WO_2$ or $W_2O_3$ film on; in addition, the EPMA detected no Ni on the sample's surface. This result has demonstrated that only $WO_3$ among the tungsten oxides exhibits the ability of reduction on NiO.

Next, a similar experiment was conducted by regulating $O_2$ partial pressure in sputtering, followed by forming a WOx film having an oxygen ratio x of 0.25 to 3.2 (i.e., a WOx film ranging from $WO_{0.25}$ to $WO_{3.2}$) onto NiO. Oxygen ratio exhibiting the ability of reduction on NiO was equal to or greater than three.

The foregoing demonstrates that tungsten oxides having the action of reduction on NiO are compounds including from a compound with W:O=1:3, which is the composition ratio of oxygen to tungsten, to a compound with excess of oxygen (i.e., WOx of x≥3).

This embodiment enables the surface of the HTL 3 being in contact with the REL 2 to undergo reduction by catalysis using the foregoing compounds, to thus form a defect onto the surface of the HTL 3 being in contact with the REL 2. This embodiment can consequently achieve an effect similar to that in the first embodiment.

Third Embodiment

This embodiment will describe a difference between this embodiment and the first and second embodiments. For convenience in description, components with the same functions as the components described in the first and second embodiments will be denoted by the same signs, and their detailed description will be omitted.

The second embodiment has described an instance where WOx(x≥3), a reducing catalyst, is used as a reducing material. A reducing catalyst used in this present disclosure needs to be any substance that has such action that a substance constituting the HTL 3 receives electrons to be thus deprived of oxygen, or has the action of promoting a reaction by which the substance constituting the HTL 3 bonds with hydrogen, and that can obtain the substance constituting the HTL 3 in a solid state at room temperature and under a normal-pressure atmosphere. Accordingly, the REL 2 may contain a reducing catalyst other than WOx (x≥3) as a reducing material.

The light-emitting element 10 according to this embodiment and the method for manufacturing the same are the same as those in the first and second embodiments with the exception that the REL 2 contains, as a reducing material, a reducing catalyst other than WOx (x≥3) instead of or in addition to WOx (x≥3). The longitudinal sectional view of the light-emitting element 10 according to this embodiment is thus the same as that in FIG. 1.

Examples of the reducing catalyst used in this embodiment, other than WOx (x≥3) include, but not limited to, titanium dioxide ($TiO_2$), tungsten trioxide ($WO_3$), molybdenum trioxide ($MoO_3$), a manganese (Mn)-based catalyst, and an iron (Fe)-based catalyst. Examples of the Mn-based catalyst include, but not limited to, manganese oxide (MnOx) and a quadruple manganese perovskite oxide. An example of the foregoing MnOx is MnOx (0.9≤x≤1) having oxygen composition of 0.9≤x≤1, where x denotes a deviation from stoichiometric composition due to a Mn hole. Examples of the quadruple manganese perovskite oxide include, but not limited to, $CaMn_7O_{12}$ and $LaMn_7O_{12}$. In particular, $CaMn_7O_2$ and $LaMn_7O_{12}$ has a strong ability of reduction. Furthermore, $CaMn_7O_{12}$, which is an oxide of Ca and Mn, can be synthesized easily in the atmosphere and under normal pressure. An example of the iron-based catalyst is a triiron-tetraoxide-based catalyst containing triiron tetraoxide ($Fe_3O_4$). Examples of the triiron-tetraoxide-based catalyst include, but not limited to, triiron tetraoxide ($Fe_3O_4$), a mixture of $Fe_3O_4$ and potassium oxide ($K_2O$), and a mixture of $Fe_3O_4$, calcium oxide (CaO) and $K_2O$. As earlier described, $Fe_3O_4$ alone functions as a reducing catalyst. The ratio of these mixtures is thus non-limiting. These reducing catalysts may be used alone or in combination, as appropriate, with two or more kinds.

The foregoing reducing catalyst may contain at least one compound selected from the group consisting of, for instance, $TiO_2$, $MoO_3$, $MnOx$ ($0.9 \leq x \leq 1$), a quadruple manganese perovskite oxide, and a triiron-tetraoxide-based catalyst. As a matter of course, the reducing catalyst may be used in combination with $WOx$ ($x \geq 3$) described in the second embodiment, as earlier described. That is, the reducing catalyst may contain at least one compound selected from the group consisting of $WOx$ ($x \leq 3$), $TiO_2$, $MoO_3$, $MnOx$ ($0.9 \leq x \leq 1$), a quadruple manganese perovskite oxide, and a triiron-tetraoxide-based catalyst.

The following describes an evaluation result about an effect of reduction of the HTL 3 by the use of $TiO_2$ as a reducing catalyst.

Multiple samples with a film of $TiO_2$ for instance formed on the HTL 3, which was herein a nickel oxide (NiO) film, were produced by changing the thickness of the $TiO_2$ film and were maintained (heated) at 200° C. for five hours, followed by evaluation on the presence or absence of reduction of the NiO film. The reduction of the NiO film was found in $TiO_2$ having a thickness equal to or greater than 0.5 nm. In addition, a $TiO_2$ film of flat thickness was successfully obtained with $TiO_2$ having a thickness equal to or greater than 1 nm. Further, with $TiO_2$ having a thickness less than 1 nm, the flatness was lost, and with $TiO_2$ having a thickness less than 0.5 nM, $TiO_2$ was changed into an island shape rather than a continuous film.

It is noted that the condition, i.e., five-hour heating at 200° C., is for emphasizing the action of reduction on the NiO film, and in actual application to the light-emitting element 10, short-time heating, i.e., heating at less than 200° C. for less than five hours, is required.

This embodiment enables the surface of the HTL 3 being in contact with the REL 2 to undergo reduction by catalysis using the foregoing compounds, to thus form a defect onto the surface of the HTL 3 being in contact with the REL 2, as earlier described. This embodiment can consequently achieve an effect similar to that in the first and second embodiments.

Fourth Embodiment

This embodiment will describe a difference between this embodiment and the first to third embodiments. For convenience in description, components with the same functions as the components described in the first to third embodiments will be denoted by the same signs, and their detailed description will be omitted.

Figure 5:
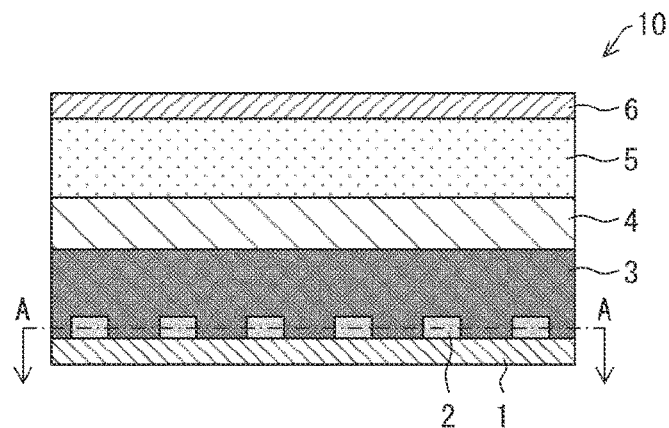
FIG. 5 is a longitudinal sectional view of an example schematic configuration of a light-emitting element according to a fourth embodiment.
Figure 6:
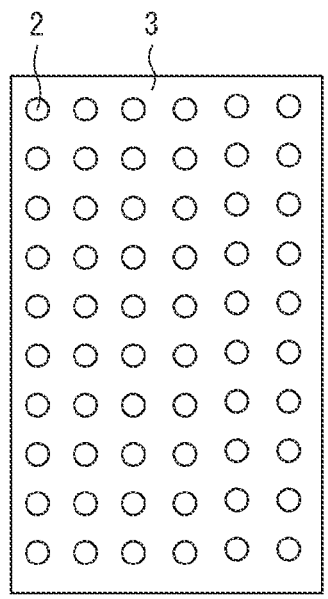
FIG. 6 is a sectional view of the light-emitting element taken along line A-A in FIG. 5.

FIG. 5 is a longitudinal sectional view of an example schematic configuration of the light-emitting element 10 according to this embodiment cut in the direction of the normal to the light-emitting element 10 (that is, the light-emitting element 10 cut in its stacking direction). FIG. 6 is a sectional view of the light-emitting element 10 taken along line A-A in FIG. 5. FIG. 6 corresponds to a drawing illustrating, when viewed from above (i.e., in a plan view), the REL 2 and HTL 3 of the light-emitting element 10 according to this embodiment cut, within the REL 2, along a plane perpendicular to the staking direction.

The light-emitting element 10 according to this embodiment and a method for manufacturing the same are the same as those in the first to third embodiments with the exception that, as illustrated in FIG. 5, a plurality of RELs 2 are arranged discretely in island form rather than in the form of a continuous film.

FIG. 6 illustrates an instance where a plurality of island-shaped RELs 2 are distributed uniformly in a plan view, all over the emission region of the light-emitting element 10 (to be more specific, all over the upper surface of the HTL 3).

Herein, the emission region of the light-emitting element 10 is a region where light is emitted in the light-emitting element 10. When an edge cover (not shown) is disposed between the anode 1 and cathode 6 so as to cover the end of the anode 1, for instance, the emission region of the light-emitting element 10 refers to the opening of the edge cover exposing the inside of the anode 1.

The RELs 2 can be formed in island form having a desired pattern by for instance, in Step S2, forming the REL 2 through sputtering or evaporation using a mask having a plurality of openings. As a matter of course, Step S2 may include forming the REL 2 through, for instance, sputtering or evaporation, followed by patterning through photolithography to thus form an island shape having a desired pattern.

As illustrated in FIG. 5 and FIG. 6, the HTL 3 is located between the island-shaped RELs 2 in a plan view. As illustrated in FIG. 6, the anode 1 is provided in contact with the island-shaped RELs 2 and in contact with the HTL 3 located between the island-shaped RELs 2.

The first to third embodiments have described an instance where the REL 2 is a continuous film, as illustrated in FIG. 1. Here, when a defect level can be formed in even a part of the surface of the HTL 3 adjacent to the anode 1, the Fermi level of the anode 1 can undergo pinning to the defect level. When the Fermi level of the anode 1 can even partly undergo pinning, the Fermi level of the anode 1 in whole can undergo pinning. Moreover, when the Fermi level of the anode 1 can even partly undergo pinning, the hole injection barrier Eh between the anode 1 and HTL 3 can be lowered even partly. As such, when a defect level can be formed in even a part of the surface of the HTL 3 adjacent to the anode 1, the efficiency of hole injection can improve further than before.

The HTL 3 does not thus necessarily have to have a defect all over the surface adjacent to the anode 1. The REL 2 does not thus necessarily have to be a continuous film. This embodiment can achieve an effect similar to that in the first to third embodiments.

A commonly used HTL material has high resistance and is thin, i.e., about several-ten nanometer thick; hence, current spread in the lateral direction (in-plane direction) of the HTL 3 is small, and thus current tends to flow immediately upward. The REL 2 between the anode 1 and HTL 3 improves hole injection efficiency at the contact portion between the REL 2 and anode 1. However, current tends to flow immediately above the contact portion between the REL 2 and anode 1, as described above, and is less likely to spread around the contact portion. For this reason, an emission pattern with the light-emitting element 10 viewed right opposite the emission region possibly does not necessarily emit light uniformly. Accordingly, making the distribution at the contact portion uniform within the emission region enables the emission pattern to be uniform. Even for a discontinuous contact portion, making the area at the contact portion highly dense enables the emission pattern to be further uniform.

Fifth Embodiment

This embodiment will describe a differences between this embodiment and the first to fourth embodiments. For convenience in description, components with the same functions as the components described in the first to fourth embodiments will be denoted by the same signs, and their detailed description will be omitted.

Figure 7:
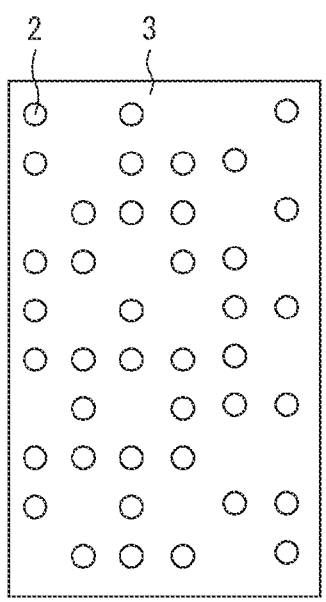
FIG. 7 is a lateral sectional view of an example schematic configuration of a light-emitting element according to a fifth embodiment.

FIG. 7 is a lateral sectional view of an example schematic configuration of the light-emitting element 10 according to this embodiment cut in its horizontal direction. To be specific, FIG. 7 corresponds to a drawing illustrating, when viewed from above (i.e., in a plan view), the REL 2 and HTL 3 of the light-emitting element 10 according to this embodiment cut, within the REL 2, along a plane perpendicular to the staking direction. FIG. 7 corresponds to the sectional view of the light-emitting element 10 taken along line A-A in FIG. 5.

The light-emitting element 10 according to this embodiment and a method for manufacturing the same are the same as those in the first to fourth embodiments with the exception that, as illustrated in FIG. 7, a plurality of island-shaped RELs 2 are distributed non-uniformly (irregularly) in a plan view, all over the emission region of the light-emitting element 10 (to be more specific, all over the upper surface of the HTL 3).

As described in the fourth embodiment, when a defect level can be formed in even a part of the surface of the HTL 3 adjacent to the anode 1, the Fermi level of the anode 1 can undergo pinning to the defect level. This can improve hole injection efficiency further than before.

The RELs 2 may be thus distributed non-uniformly in a plan view, as described above. This embodiment can achieve an effect similar to that in the first to fourth embodiments.

Sixth Embodiment

This embodiment will describe a differences between this embodiment and the first to fifth embodiments. For convenience in description, components with the same functions as the components described in the first to fifth embodiments will be denoted by the same signs, and their detailed description will be omitted.

Figure 8:
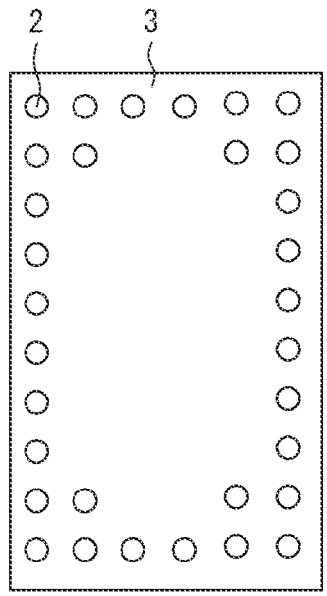
FIG. 8 is a lateral sectional view of an example schematic configuration of a light-emitting element according to a sixth embodiment.

FIG. 8 is a lateral sectional view of an example schematic configuration of the light-emitting element 10 according to this embodiment cut in its horizontal direction. FIG. 8 is a lateral sectional view of an example schematic configuration of the light-emitting element 10 according to this embodiment cut in its horizontal direction. To be specific, FIG. 8 corresponds to a drawing illustrating, when viewed from above (i.e., in a plan view), the REL 2 and HTL 3 of the light-emitting element 10 according to this embodiment cut, within the REL 2, along a plane perpendicular to the staking direction. FIG. 8 corresponds to the sectional view of the light-emitting element 10 taken along line A-A in FIG. 5.

The light-emitting element 10 according to this embodiment and a method for manufacturing the same are the same as those in the first to fifth embodiments with the exception that, as illustrated in FIG. 8, a plurality of island-shaped RELs 2 are distributed non-uniformly (irregularly) in a plan view in the emission region of the light-emitting element 10 (to be more specific, the upper surface of the HTL 3 in the example in FIG. 8) in such manner that the density of arrangement of the RELs 2 is higher at the perimeter of the emission region of the light-emitting element 10 than at the center of the emission region.

The "density of arrangement of the RELs 2" indicates the density of area of how much the island-shaped RELs 2 are in contact with the anode 1 with respect to the area of the emission region of the light-emitting element 10.

Hole injection efficiency can improve further than before in this case as well, for the same reason as that described in the fourth and fifth embodiments. An effect can be consequently achieved that is similar to that in the first to fifth embodiments. This embodiment enables formation of a surface defect at the perimeter of the emission region of the light-emitting element 10, where an electric field tends to concentrate. The Fermi level of the anode 1 can consequently undergo pinning at the perimeter, where an electric field tends to concentrate, to thus improve hole injection efficiency.

In some embodiments, there may be no REL 2 at the center of the emission region, as illustrated in FIG. 8.

Seventh Embodiment

This embodiment will describe a differences between this embodiment and the first to sixth embodiments. For convenience in description, components with the same functions as the components described in the first to sixth embodiments will be denoted by the same signs, and their detailed description will be omitted.

Figure 9:
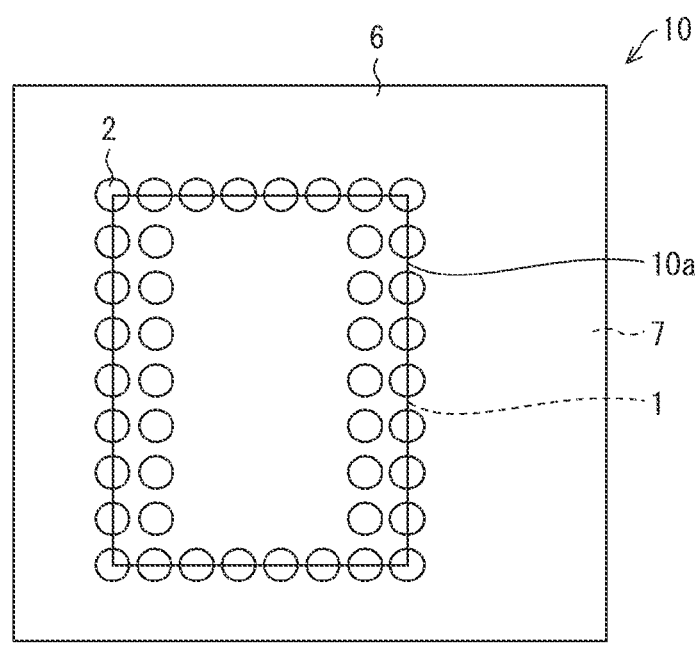
FIG. 9 is a perspective view of a schematic configuration of main components of a light-emitting element according to a seventh embodiment.

FIG. 9 is a perspective view of a schematic configuration of main components of the light-emitting element 10 according to this embodiment. To be more specific, FIG. 9 is a perspective view of the REL 2 of the light-emitting element 10 according to this embodiment viewed from above the light-emitting element 10.

The light-emitting element 10 according to this embodiment includes, between the anode 1 and cathode 6, an edge cover 7 covering the end of the anode 1. The opening of the edge cover 7, exposing the inside of the anode 1, is an emission region 10a of the light-emitting element 10 according to this embodiment. The light-emitting element 10 according to this embodiment is the same as that in the sixth embodiment with the exception that the end of the emission region 10a of the light-emitting element 10 and a plurality of RELs 2 overlap.

The REL 2 in this embodiment as well can be formed in island form having a desired pattern by forming the REL 2 through sputtering or evaporation using a mask having a plurality of openings. As a matter of course, Step S2 may include forming the REL 2 through, for instance, sputtering or evaporation, followed by patterning through photolithography to thus form an island shape having a desired pattern.

In this case as well, an effect similar to that in the sixth embodiment can be achieved for the same reason as that in the sixth embodiment.

The present disclosure is not limited to the foregoing embodiments. Various modifications can be devised within the scope of the claims. An embodiment that is obtained in combination, as appropriate, with the technical means disclosed in the respective embodiments is also included in the technical scope of the present disclosure. Furthermore, combining the technical means disclosed in the respective embodiments can form a new technical feature.

The invention claimed is:

1. A light-emitting element comprising, in an order of listing:
    an anode;
    a hole transport layer;
    an emission layer; and
    a cathode,
    the light-emitting element further comprising:
    a reducing-material-containing layer disposed in at least a part between the anode and the hole transport layer, the reducing-material-containing layer being in contact with the anode and the hole transport layer, the reducing-material-containing layer containing a reducing material that reduces the hole transport layer, wherein
    the reducing material contains, in a structure of the reducing material, hydrogen either at a concentration ratio of 1 to 1 with respect to a base metal, or at a larger concentration ratio than the base metal.

2. The light-emitting element according to claim 1, wherein
the reducing material contains at least one of hydrogen-absorbing materials that absorb hydrogen through transformation into a solid solution, or through chemical bonding, the hydrogen-absorbing materials comprising a hydrogen-absorbing metal and a hydrogen-absorbing alloy.

3. The light-emitting element according to claim 1, wherein
the reducing material contains either at least one hydrogen-absorbing metal or at least one hydrogen-absorbing alloy selected from the group consisting of
either a metal or an alloy containing at least one element selected from the group consisting of palladium, platinum, hafnium, and tantalum,
an AB2-type alloy,
an AB5-type alloy,
an alloy containing titanium and iron,
an alloy containing vanadium,
an alloy containing magnesium,
an alloy containing palladium, and
an alloy containing calcium.

4. The light-emitting element according to claim 1, wherein the reducing material contains a reducing catalyst.

5. The light-emitting element according to claim 4, wherein the reducing catalyst contains WOx, where x≥3 is satisfied.

6. The light-emitting element according to claim 4, wherein the reducing catalyst contains at least one compound selected from the group consisting of $TiO_2$, $MoO_3$, MnOx, a quadruple manganese perovskite oxide, and a triiron-tetraoxide-based catalyst containing triiron tetraoxide, where 0.9≤x≤1 is satisfied.

7. The light-emitting element according to claim 1, wherein the reducing-material-containing layer has a thickness of 0.5 to 1 nm inclusive.

8. The light-emitting element according to claim 1, wherein the reducing-material-containing layer is in a form of a continuous film.

9. The light-emitting element according to claim 1, wherein a plurality of reducing-material-containing layers, including the reducing-material-containing layer, is are arranged discretely in an island form.

10. The light-emitting element according to claim 9, wherein the plurality of reducing-material-containing layers is distributed uniformly in a plan view.

11. The light-emitting element according to claim 9, wherein the plurality of reducing-material-containing layers is distributed non-uniformly in a plan view.

12. A light-emitting element comprising, in an order of listing:
an anode;
a hole transport layer;
an emission layer; and
a cathode,
the light-emitting element further comprising:
a reducing-material-containing layer disposed in at least a part between the anode and the hole transport layer, the reducing-material-containing layer being in contact with the anode and the hole transport layer, the reducing-material-containing layer containing a reducing material that reduces the hole transport layer, wherein
a plurality of reducing-material-containing layers, including the reducing-material-containing layer, is arranged discretely in an island form,
the plurality of reducing-material-containing layers is distributed non-uniformly in a plan view, and
a density of the arrangement of the plurality of reducing-material-containing layers is higher at a perimeter of an emission region of the light-emitting element than at a center of the emission region.

13. The light-emitting element according to claim 12, wherein the reducing-material-containing layer is not disposed at the center of the emission region.

14. The light-emitting element according to claim 12, wherein an end of the emission region of the light-emitting element and the plurality of reducing-material-containing layers overlap.

15. The light-emitting element according to claim 9, wherein the hole transport layer, located between the plurality of reducing-material-containing layers in a plan view, and the anode are in contact.

16. A method for manufacturing a light-emitting element, the light-emitting element including, in order of listing,
an anode,
a hole transport layer,
an emission layer, and
a cathode,
the light-emitting element including
a reducing-material-containing layer disposed in at least a part between the anode and the hole transport layer, the reducing-material-containing layer being in contact with the anode and the hole transport layer, the reducing-material-containing layer containing a reducing material that reduces the hole transport layer,
the hole transport layer having a defect on a surface being in contact with the reducing-material-containing layer,
the method comprising the steps of:
stacking the reducing-material-containing layer onto the anode so as to be in contact with the anode;
stacking the hole transport layer onto the reducing-material-containing layer so as to be in contact with the reducing-material-containing layer; and
forming a defect onto the surface of the hole transport layer being in contact with the reducing-material-containing layer, by heating a stack including the anode, the reducing-material-containing layer, and the hole transport layer to reduce the surface.

17. The method according to claim 16, wherein the step of forming the defect includes heating the stack at a temperature ranging from 150 to 250° C. inclusive.

18. The method according to claim 16, wherein the step of forming the defect includes heating the stack either in an air or under a nitrogen atmosphere.

19. The light-emitting element according to claim 12, wherein the hole transport layer, located between the plurality of reducing-material-containing layers in the plan view, and the anode are in contact.

* * * * *